United States Patent [19]

Dietrich et al.

[11] 4,214,166
[45] Jul. 22, 1980

[54] MAGNETIC LENS SYSTEM FOR CORPUSCULAR RADIATION EQUIPMENT

[75] Inventors: Isolde Dietrich; Fred Fox, both of Munich; Erwin Knapek, Unterhaching; Karl Nachtrieb, Munich; Reinhard Weyl, Assling; Helmut Zerbst; Guy Lefranc, both of Munich, all of Fed. Rep. of Germany

[73] Assignee: Siemens Aktiengesellschaft, Munich, Fed. Rep. of Germany

[21] Appl. No.: 890,922

[22] Filed: Mar. 28, 1978

[30] Foreign Application Priority Data

Jun. 10, 1977 [DE] Fed. Rep. of Germany ....... 2726195

[51] Int. Cl.² ............................................. G01N 23/00
[52] U.S. Cl. ............................. 250/396 ML; 250/397
[58] Field of Search .......... 250/396 ML, 396 R, 397, 250/398, 310; 335/210, 216; 313/361, 442

[56] References Cited

U.S. PATENT DOCUMENTS

| | | | |
|---|---|---|---|
| 3,008,044 | 11/1961 | Buchhold | 250/396 ML |
| 3,351,754 | 11/1967 | Dietrich et al. | 250/396 ML |
| 3,916,201 | 10/1975 | Herrmann et al. | 250/396 ML |
| 3,942,005 | 3/1976 | Watanabe | 250/310 |

*Primary Examiner*—Bruce C. Anderson
*Attorney, Agent, or Firm*—Kenyon & Kenyon

[57] ABSTRACT

A magnetic lens system for corpuscular radiation equipment operating in a vacuum, in particular, an objective lens system for electron microscopes, comprising a superconducting shield housing, in which are arranged, at one end, a single hollow cylindrical superconducting shielding device, wound with a lens coil, and at the other end, in front of the free end face of the shielding device, a vacuum chamber for accommodating an object to be examined, permitting the cavity to be relatively large, and detectors for radiation analysis to be arranged therein so that the lens system is therefore suitable for use in scanning electron microscopes.

15 Claims, 3 Drawing Figures

MAGNETIC LENS SYSTEM FOR CORPUSCULAR RADIATION EQUIPMENT

BACKGROUND OF THE INVENTION

This invention relates to corpuscular radiation equipment in general, and more particularly to a magnetic lens system operating in a vacuum and comprising an improved arrangement of a shield housing, a superconducting shield, one or more lens coil windings, and a vacuum chamber for receiving the object to be examined.

One objective lens system for an electron microscope is known from U.S. Pat. No. 3,916,201. Its superconducting shielding device consists of two hollow cylindrical shielding bodies which are arranged in tandem in the beam direction axis and which closely surround the space in which the beam is conducted. The two shielding cylinders contain superconductive material which, in the operating condition, is kept below its so-called transition temperature by means of a cryogenic medium such as liquid helium. Between the adjacent end faces of these shielding cylinders a gap is developed, in which a vacuum chamber is arranged. Into this chamber an object to be examined may be introduced radially from the side by means of a separate insertion device. Because the objective space is also cooled by the cryogenic medium, lateral migration of the object due to temperature, the so-called thermal drift, can be kept extremely low, in some instances, to less than 0.03 nm/min.

Each of the two shielding cylinders is surrounded by a superconducting lens coil winding, which is short circuited in the operating condition. The effect of these shielding cylinders is that the magnetic field generated by the lens coil windings can act on the corpuscular beam only in the vicinity of the lens gap. The shielding cylinders therefore extend at their antipodal ends to regions of negligible field strength.

The two shielding cylinders are further connected to a shield housing of superconductive material which directly encloses on all sides the lens coil winding arranged around the shielding cylinders, except for the portions of the surface facing the shielding cylinders. Kept in the superconducting state, the shield housing limits the extent of the magnetic field produced by the lens coil windings, and shields the gap region to a high degree against external magnetic interference fields, particularly alternating fields.

It is well known that the resolution of corpuscular radiation equipment depends on the so-called aperture error constant of its lenses, and in particular, of its objective lens. The size of the lens gap between opposite end faces of the two shielding cylinders is therefore chosen in presently used electron microscopes so that very small values are achieved for the aperture error constant $C_{\ddot{o}}$, the chromaticity error constant $C_F$ and the focal length f. The aperture error constant depends on the maximum value $H_O$ of the field intensity or, equivalently, the maximum value $B_O$ of the magnetic induction in the lens gap, i.e., the region in which the magnetic field acts on the corpuscular beam. The constant also depends on the field gradient along the beam direction axis in the lens gap. Assuming an approximately Gaussian axial distribution of the field intensity in the lens gap, the half-width of the Gaussian determines the field gradient for a given maximum field strength. This half-width depends on the dimensions of the two shielding cylinders used for forming the lens gap in the vicinity of their opposite end faces. Both the distance between the two shielding cylinders, i.e., the gap length in the beam direction, and the shape of the shielding cylinders in the vicinity of the opposing end faces affect the half-width.

Such an objective lens system, with an aperture error constant $C_{\ddot{o}}$ of about 1.45 mm, a gap width of 5 mm, a maximum induction of 2.1 Tesla, and a half-width of 4.4 mm, was tested in an electron microscope with a beam voltage of 220 kV. It was possible to reach the theoretical resolution limit. Cf. Optik Vol. 45 No. 3 at 291–94 (1976). The objective lens system described therein is particularly suited for electron microscopes of the so-called fixed-beam type, in which a focused electron beam, held immovable by means of magnetic fields, irradiates an object, of which a magnified image is generated by means of downstream magnetic magnification lenses.

The known objective lens system, however, is not directly applicable to the so-called transmission-type scanning electron microscopy. In this technique, a sharply focused electron beam sweeps over the surface of the object to be examined according to a predetermined raster pattern. This primary electron beam generates secondary electrons at every point of the surface. If these secondary electrons, as well as possible Auger electrons and backscatter electrons are to be collected for additional energy dispersion analsyses, then the appropriate detector devices must be arranged in the immediate vicinity of the object. However, this is not directly possible with the known objective lens system, as the object space is too small. For beam voltages under 250 kV, sufficient space can be gained by enlarging the lens gap only if an increase of the aperture error constant $C_{\ddot{o}}$, the chromaticity error constant $C_F$ and the focal length f by about one order of magnitude can be tolerated.

SUMMARY OF THE INVENTION

It is the object of the present invention to rearrange the known objective lens system in such a manner that an electron microscope equipped therewith may be set up for transmission-type scanning electron microscopy without the need of abandoning important advantages of the known fixed-beam electron microscope objective. In this arrangement, the object to be examined should exhibit a very small thermal drift, and the corpuscular beam should at the same time be well shielded against external magnetic interference fields. In addition, it should be possible to tilt the object, and to perform on it energy dispersion analyses.

The present invention satisfies these requirements with a single superconducting cylinder as the shielding device. Between the one end face of the device and the corresponding flat side of a lens coil winding about the cylinder, on one side, and the inside of the superconducting shield housing facing these surfaces, on the other side, a cavity is formed in which the vacuum chamber for receiving the object to be examined is arranged.

This embodiment of the lens system has the particular advantage that it can be used simultaneously for scanning electron microscopy and for fixed beam electron microscopy, as the cavity in the interior of its shield housing can be made large enough to accommodate a vacuum chamber for the object to be examined as well as detectors for energy dispersion analyses. The maximum field strength on the cavity side of the free end face of the single shielding cylinder is sufficiently high for scanning electron microscopy, and the half-width of the corresponding field curve is small enough to keep the imaging errors of the lens system small.

DETAILED DESCRIPTION OF THE INVENTION

Figure 1:
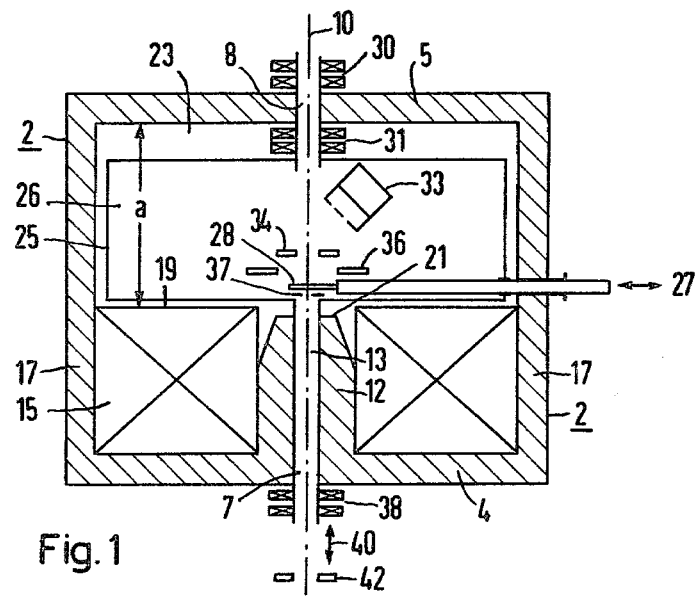
FIG. 1 is a cross-sectional view of a first embodiment of the lens system of the present invention.

The objective lens system shown in FIG. 1 is suitable for a transmission type scanning as well as for a transmission type fixed-beam electron microscope. The parts of the microscope not shown in this figure are known per se, and can correspond, for instance, to the parts of the electron microscope disclosed in the U.S. Pat. No. 3,916,201. The objective lens system comprises a hollow cylindrical closed shield housing 2 which consists of superconductive material and which is held, in the operating condition, at a temperature below the critical temperature of the material by means of a cryogenic medium. It contains a bottom part 4 and a top part 5, each provided with a central opening 7 and 8, respectively, through which an electron beam directed along an axis 10 is conducted through the shield housing. In the interior of the shield housing a shielding cylinder 12 with a central bore hole 13, which has a relatively small diameter, stands concentrically to the beam direction axis 10, on the bottom part 4. The shielding cylinder likewise consists of superconductive material, and can form a common shaped piece with the shield housing 2. It is advantageously cooled by the same cryogenic medium which is required for the shield housing 2. The shielding cylinder 12 is furthermore surrounded by a current carrying lens coil winding 15 which fills the annular space formed between the shielding cylinder and the side wall 17 of the shield housing 2. The conductors of the coil winding 15 are also superconductors, so that the coil winding can be short circuited in the known manner in the operating condition. The upper flat side 19 of this annular coil winding 15, which is antipodal to the bottom part 4, projects slightly beyond the corresponding end face 21 of the shielding cylinder 12. The top part 5 of the shield housing 2 does not rest immediately against the upper flat side 19 of the lens coil winding 15 or the upper end face 21 of the shielding cylinder 12; instead a predetermined distance a is formed between the parts 5 and 19. As a result, a cylindrical cavity 23 above the lens coil winding 15 and the shielding cylinder 12 is obtained within the interior enclosed by the shield housing 2. In this cavity 23, a vacuum chamber 25 is arranged, into the object space 26 of which an object 28 to be examined may be inserted from the side by means of a specimen slide 27 and may be brought into the electron beam in front of the free end face 21 of the shielding cylinder 12. The devices required for introducing the object 28 into the object space 26, as well as for mounting, are known and not shown in the figure.

To direct the electron beam through the object 28 according to a raster pattern, two suitable deflection systems 30 and 31 are included in the embodiment of FIG. 1. The first deflection system 30 is located outside the shield housing 2 in the immediate vicinity of the top part 5, while the deflection system 31 is arranged on the inside of the top part within the interior 23 enclosed by the shield housing 2. This further deflection system 31 can serve simultaneously as a stigmator system, by means of which deviations of the magnetic fields from rotational symmetry can be corrected. These coils for correcting the direction of the guided beam may contain superconducting material, and may be cooled by the same cryogenic medium as the shielding device.

In the objective lens system of a transmission-type scanning electron microscope only a resolution of the order of 0.3 nm is necessary. The maximum field strength along the beam direction axis 10 in front of the free end face 21 of the shielding cylinder 12 needs therefore to reach only a relatively low value, in the order of one Tesla. Hence, the cavity 23 inside the shield housing 2, and likewise the vacuum chamber 25, can be made large enough to accommodate additional devices for further radiation analyses in proximity to the object 28. In the figure, a detector 33, which is to contain a suction device for imaging with Auger and secondary electrons, a backscatter electron detector 34, and a ring detector 36 of lithium doped silicon for energy dispersion X-ray analysis are indicated. Diaphragms 37 may also be provided in the object space 26 directly below the object to be examined. In addition, the object may be tilted, i.e., the angle made by its surface normal to the beam direction axis 10 varied to a predetermined value, so that the direction of definite crystal axes may be taken into consideration in examining the object.

The density of the electron beam for transmission type scanning electron microscopy is generally relatively high, so that a correspondingly high contamination of the object might be expected. In the lens system according to the present invention, however, contamination is practically impossible as the object stage is deep cooled from the start; as the vacuum chamber 25 is enclosed on all sides by deep cooled components, the object space 26 and therefore also the object are at the very low temperature. Drift due to thermal causes is therefore as low as is that due to external interference fields, which are kept from the object space 26 by the shield housing 2, and may be of the order of 0.01 nm/min.

The electron beam leaves the shield housing 2 via the opening 7 of the bottom part 4. At this point, a further stigmator system 38 may be employed to correct the magnetic fields acting on the electron beam. Again, these may be superconducting in the operating state. The post-magnifying lenses of the electron microscope following thereupon in the beam path are known per se, and are only indicated in the figure by a double arrow 40. At the end of this post-magnifying lens system there is a detector 42 for picking up the electrons inelastically scattered in the object 28.

Figure 2:
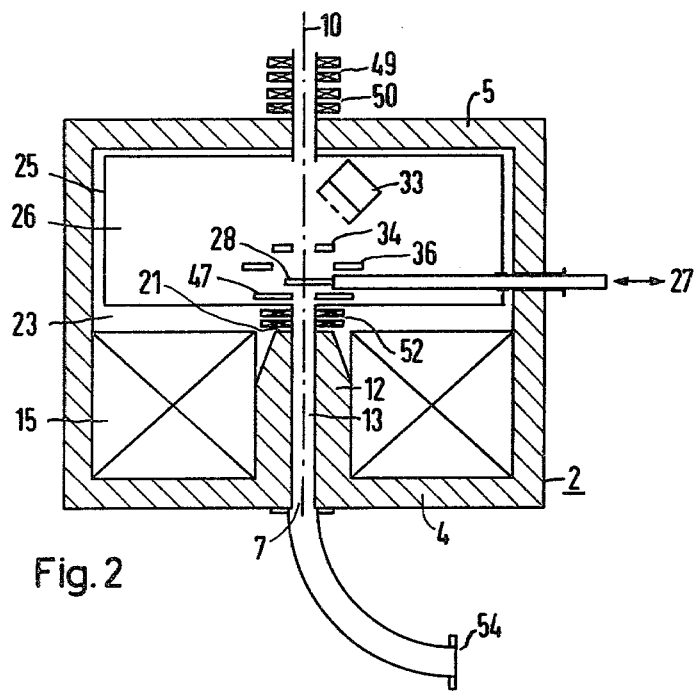
FIG. 2 is a cross-sectional view of an alternate embodiment of the lens system of the present invention.

Unlike the embodiment of the objective lens system according to FIG. 1, which is suitable for a scanning as well as for a fixed beam electron microscope, the objective lens system according to FIG. 2 can be used only for electron microscopes of the scanning type. A detector 47 which is required for registering the electrons elastically scattered in the object 28 can therefore be arranged within the objects space 26 of the vacuum chamber directly under the object 28. This detector 47 can also pick up all elastically scattered electrons. In the vacuum chamber 25 are also depicted the devices for radiation analysis discussed for the FIG. 1 embodiment. The deflection systems 49 and 50, required for deflecting the electron beam in the scanning technique, are arranged outside the shield housing 2 above the top part 5 concentrically with the beam direction axis 10. A stigmator system 52 is further provided between the detector 47 for registering the scattered electrons and the free end face 21 of the shielding cylinder 12. In addition, a spectrometer 54 is indicated in the figure, following the objective lens system and by which the energy loss of the inelastically scattered electrons can be measured. The aperture angle defined by the diameter of the bore holes 13 and 7 in the shielding cylinder 12 and the bottom part 4 of the shield housing 2, respectively, is sufficient therefor. The other parts designated in the figure correspond to those in the lens system according to FIG. 1.

Figure 3:
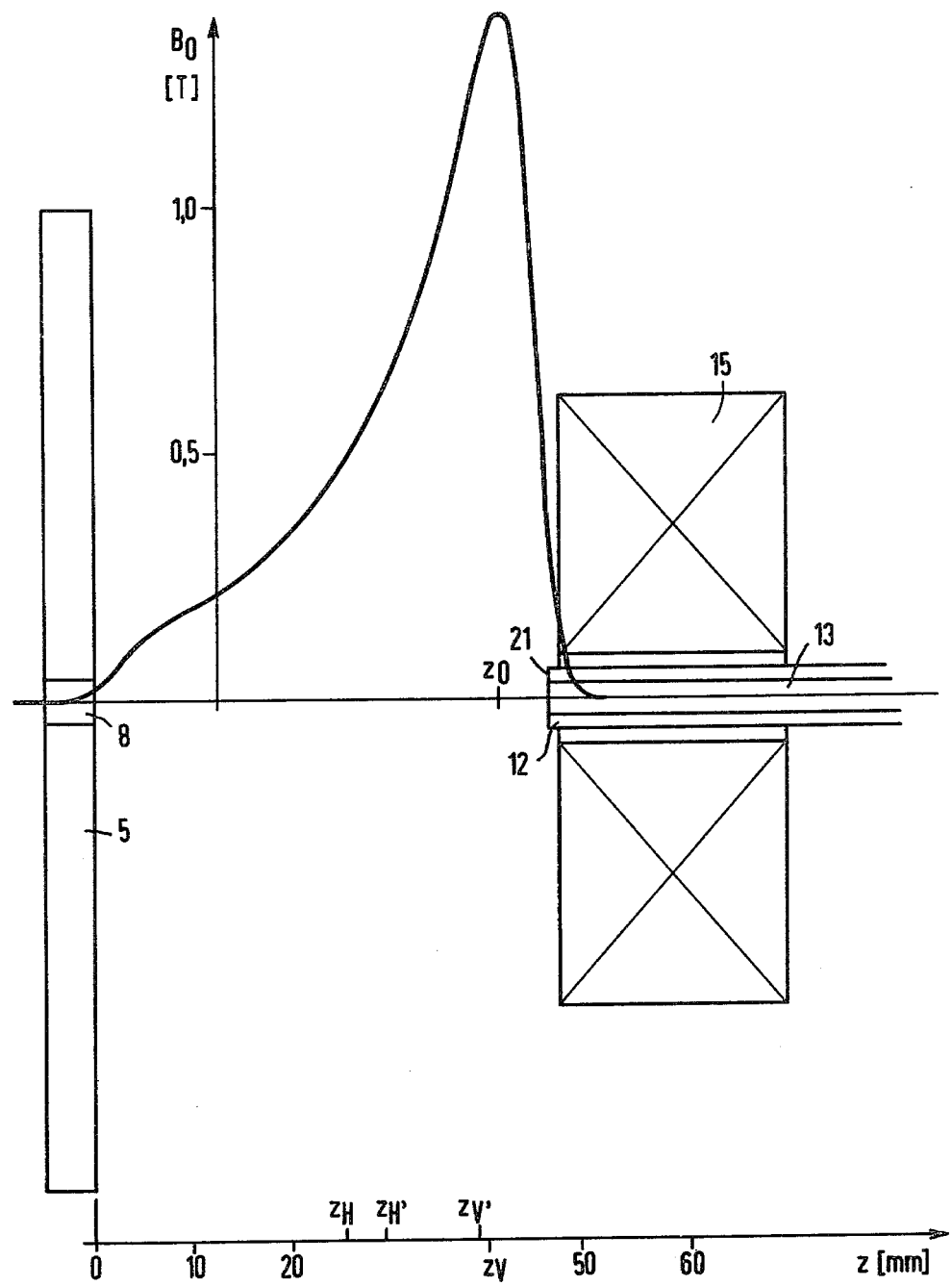
FIG. 3 is an illustration of the field strength distribution produced in one corresponding embodiment of the objective lens of the invention.

In FIG. 3, the axial field distribution in an analysis objective according to FIG. 1 or 2 is reproduced in a diagram. The position z of the measuring points in front of the free end face 21 of a shielding cylinder 12, which is surrounded by a lens coil winding 15, is given on the abscissa in the beam direction in millimeters, while the measured magnetic induction $B_O$ in Tesla is plotted on the ordinate. The field distribution measured in FIG. 3 is based on an embodiment example of an objective lens system with the data shown in the following Table 1:

Table 1

| | |
|---|---|
| Diameter of shield housing 2 | 100 mm |
| Length of shield housing 2 | 100 mm |
| Length of shielding cylinder 12 | 40 mm |
| Diameter of bore hole 13 of the shielding cylinder 12 | 3 mm |
| Outside diameter of coil winding 15 | 60 mm |
| Inside diameter of coil winding 15 | 20 mm |

The effective current density in the lens coil winding 15 is about $1.5 \times 10^4$ A/cm$^2$. This results in a value of the maximum induction $B_O$ of the field in front of the shielding cylinder 12 of about 1.4 Tesla.

The electron-optical parameters obtained with these data depend on the beam voltage of the electron microscope and are given in the following Table 2.

Table 2

| | Beam Voltage | |
|---|---|---|
| | 150 kV | 250 kV |
| Front focal length $f_V$ | 2.2 mm | 2.9 mm |
| Rear focal length $f_H$ | 9.8 mm | 10.6 mm |
| Aperture error constant $C_o$ | 1.75 mm | 2.7 mm |
| Chromaticity error constant $C_F$ | 1.7 mm | 2.2 mm |
| Focal point coordinates: | | |
| Front focal point coordinate $z_V$ or $z_{V'}$ | −0.5 mm | −2 mm |
| Rear focal point coordinate $z_H$ or $Z_{H'}$ | −15 mm | −11 mm |

The zero coordinate $z_o$, to which the focal point coordinates are referred, is assumed to be that location on the abscissa, at which the induction $B_o$ assumes its maximum value. The focal point coordinates obtained with a beam voltage of 250 kV are noted by a prime to distinguish them from the corresponding coordinates obtained at 150 kV.

As can be seen from Table 2, the front and rear focal point coordinates $z_{V'}$ and $z_{H'}$ are closer together at the higher beam voltage of 250 kV than at the lower beam voltage of 150 kV. The distance between the focal point coordinates associated with each beam voltage is, on the one hand, large enough to avoid multiple constrictions of the electron beam, which lead to difficulties in adjusting the lens system, and on the other hand, small enough to allow a short overall design of the electron microscope. For transmission type scanning electron microscopes with the lens system according to the present invention, relatively low beam voltages between 100 and 500 kV can therefore be provided; the lens power can be kept under $k^2=5$.

In the embodiments according to FIGS. 1 to 3, it is assumed that the cavity 23 is always located ahead of the shielding cylinder 12, as seen in the direction of the beam. The cavity can equally well also be provided behind the shielding cylinder 12, i.e., the shielding cylinder 12 with the coil winding 15 can be accommodated in the upper part of the space enclosed by the shield housing 2. The object to be examined then would have to be arranged below this cylinder.

In addition, the top part 5 of the shield housing 2 may also consist, if appropriate, of ferromagnetic material.

What is claimed is:

1. A magnetic lens system for corpuscular radiation equipment operating in a vacuum, which is capable of being set up for transmission type scanning, comprising:
   (a) a shield housing of superconducting material provided with openings to allow passage of a corpuscular beam;
   (b) a shielding device consisting of one hollow shielding cylinder of superconductive material disposed coaxially with the beam direction axis of the lens system and situated within the shield housing in such a manner that one end is separated from the facing interior surface of the shield housing, thereby defining a cavity within the shield housing;
   (c) at least one current carrying lens coil winding, which is arranged about the shielding device and within the shield housing so that its flat side at the cavity end of the shield device further defines the cavity, generating a magnetic field for beam guidance, said shield housing and shielding cylinder guiding said magnetic field within said cavity; and
   (d) a vacuum chamber arranged in the cavity to receive an object to be examined.

2. The magnetic lens system of claim 1, wherein the shielding cylinder is connected to the shield housing at its end face antipodal to the free face end defining the cavity.

3. The magnetic lens system of claim 2, wherein the shielding cylinder forms one shaped piece with the shield housing.

4. The magnetic lens system of claim 1, and further comprising means for radiation analysis arranged inside the vacuum chamber.

5. The magnetic lens system of claim 4, wherein said means for radiation analysis includes an Auger electron detector.

6. The magnetic lens system of claim 4, wherein said means for radiation analysis includes a secondary electron detector.

7. The magnetic lens system of claim 4, wherein said means for radiation analysis includes a backscattering electron detector.

8. The magnetic lens system of claim 4, wherein said means for radiation analysis includes a silicon detector for energy dispersion radiation analysis.

9. The magnetic lens system of claim 1, and further comprising a means for generating a raster pattern.

10. The magnetic lens system of claim 9, wherein said means for generating a raster pattern comprises at least one deflection system preceding the object on the beam path and positioned inside the cavity.

11. The magnetic lens system of claim 9, wherein said means for generating a raster pattern comprises at least one deflection system preceding the object on the beam path and positioned outside the cavity.

12. The magnetic lens system of claim 1, wherein the conductors of the lens coil winding contain superconductive material.

13. The magnetic lens system of claim 1, and further comprising coils for correcting the direction of the guided beam.

14. The magnetic lens system of claim 13, wherein the conductors of at least some of said coils for correcting the direction of the guided beam contain superconductive material.

15. The magnetic lens system of claim 1, wherein the shield housing contains at its end face facing the vacuum chamber a top part consisting of ferromagnetic material.